(12) United States Patent
Kubodera et al.

(10) Patent No.: US 6,759,633 B2
(45) Date of Patent: Jul. 6, 2004

(54) HEAT TREATING DEVICE

(75) Inventors: Masato Kubodera, Nirasaki (JP); Masaki Sohma, Nirasaki (JP); Katsumi Sekiguchi, Nirasaki (JP); Shigeru Kasai, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/258,797

(22) PCT Filed: Jan. 31, 2002

(86) PCT No.: PCT/JP02/00787
§ 371 (c)(1),
(2), (4) Date: Oct. 28, 2002

(87) PCT Pub. No.: WO02/068711
PCT Pub. Date: Sep. 6, 2002

(65) Prior Publication Data
US 2003/0075535 A1 Apr. 24, 2003

(30) Foreign Application Priority Data
Feb. 27, 2001 (JP) .......................................... 2001-053090

(51) Int. Cl.[7] .................................................. F27B 5/14
(52) U.S. Cl. ...................... 219/390; 219/405; 219/411; 392/416; 392/418; 118/724; 118/725; 118/50.1
(58) Field of Search ................................. 219/390, 405, 219/411; 392/416, 418; 118/724, 725, 50.1

(56) References Cited

U.S. PATENT DOCUMENTS 5,254,171 A * 10/1993 Hayakawa et al. ......... 118/723
5,340,401 A * 8/1994 Cann .......................... 118/725
6,080,969 A * 6/2000 Goto et al. ............... 219/444.1

FOREIGN PATENT DOCUMENTS

| JP | 5-32484 | 2/1983 |
|----|---------|--------|
| JP | 7-135197 | 5/1995 |
| JP | 9-111455 | 4/1997 |
| JP | 9-263945 | * 10/1997 |

OTHER PUBLICATIONS

International Preliminary Examination Report (PCT/IPEA/409) (translated) issued for PCT/JP02/00787.

* cited by examiner

*Primary Examiner*—Shawntina Fuqua
(74) *Attorney, Agent, or Firm*—Smith, Gambrell & Russell, LLP

(57) ABSTRACT

A heat treatment system for controlling the temperature in a processing vessel. The system includes a cylindrical processing vessel; a supporting table, raised by a support from the bottom portion of the processing vessel, for mounting thereon an object to be processed; and a processing object heating part provided in the supporting table, for heating the object to be processed. In addition a thermoelectric conversion element capable of selectively heating or cooling is provided in the bottom portion of the processing vessel, a resistive heater is provided in the side wall of the processing vessel, and a temperature control part for controlling the operations of the thermoelectric conversion element and the resistive heater is provided. Thus, it is not only possible to appropriately control the temperature in the processing vessel, but it is also possible to reduce space and energy, by combining the resistive heater with a thermoelectric conversion element.

11 Claims, 4 Drawing Sheets

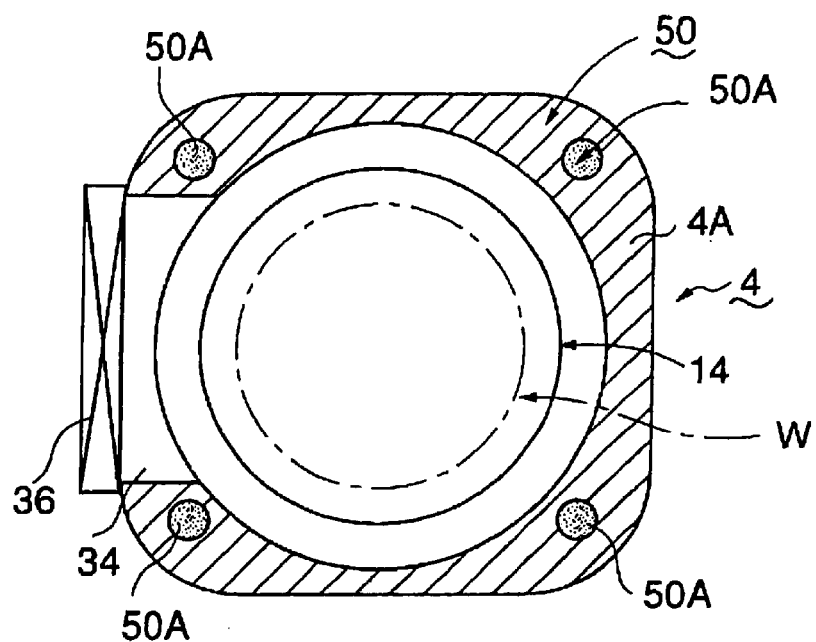
F I G. 2
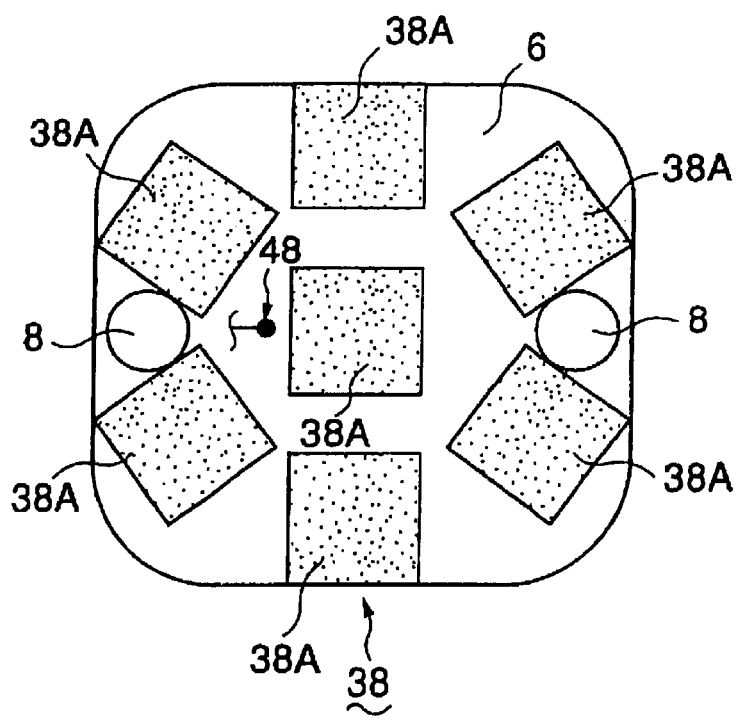
F I G. 3

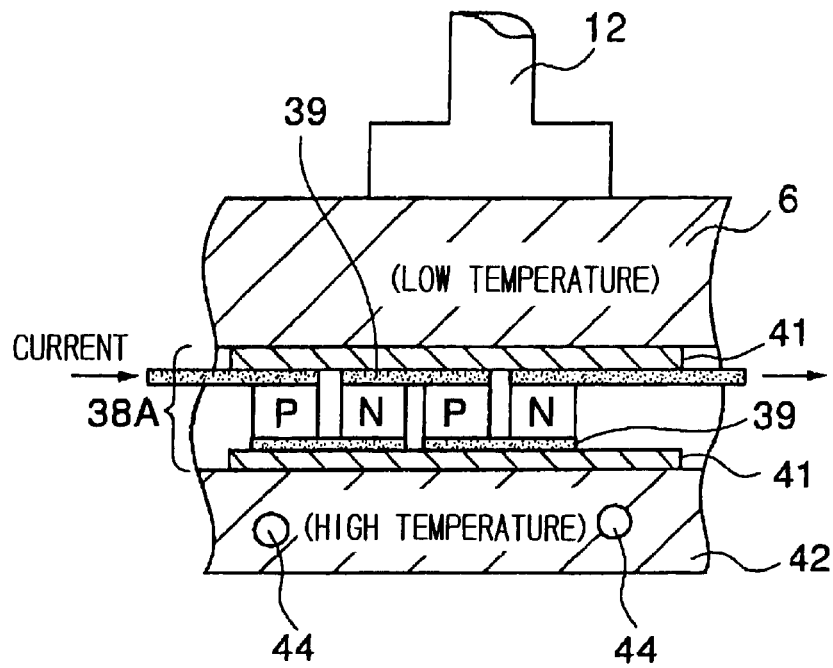
F I G. 5 (A)
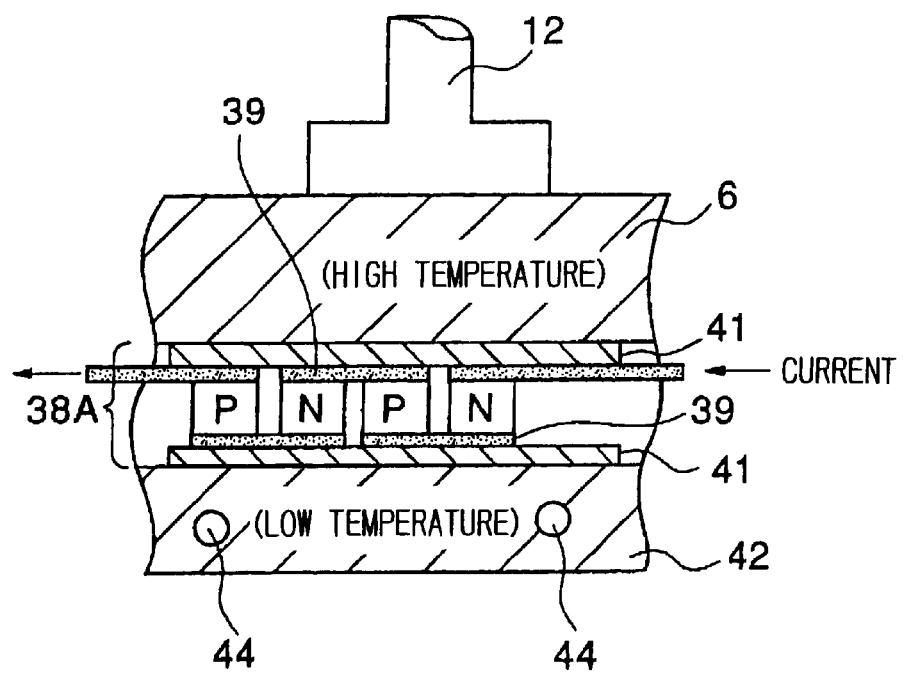
F I G. 5 (B)

HEAT TREATING DEVICE

TECHNICAL FIELD

The present invention relates generally to a heat treatment system for heat-treating a semiconductor wafer, such as a silicon substrate.

BACKGROUND ART

Generally, in order to produce a semiconductor integrated circuit, deposition, pattern etching, oxidation diffusion, annealing and so forth are repeated with respect to a silicon wafer, such as a semiconductor wafer, to form a large number of desired elements thereon.

For example, in the case of deposition, a semiconductor wafer is mounted on a supporting table in a processing vessel capable of being evacuated. This is heated by a heating means to a predetermined temperature to be maintained at the temperature. In addition, while a deposition gas is supplied into the processing vessel, the interior thereof is maintained in a predetermined reduced pressure atmosphere. Thus, a required thin film is deposited on the surface of the wafer. In this case, there are some cases where, if a certain kind of gas is used, deposition is carried out by producing plasma by a high-frequency voltage which is applied between top and bottom electrodes provided in the processing vessel.

By the way, there are recently some cases where metal films, such as Ti (titanium) films, W (tungsten) films, Ta (tantalum) films and Al (aluminum) films, and/or nitride films thereof are deposited since electric characteristics thereof are good. As raw material gases for use in deposition of films containing these metals or metal compounds, there are raw material gases having a very high vapor pressure, such as $TiCl_4$ (titanium tetrachloride), PET (pentoethoxy tantalum) and DMAH (dimethyl aluminum hexide). If such a raw material gas having a high vapor pressure is used, it is in a gas state only at high temperatures, so that produced reaction by-products are easy to adhere to the inner wall faces and bottom face of the processing vessel, the temperature of which has a tendency to lower, thereby causing particles. In addition, on some process conditions, a portion of the processing vessel, such as the bottom of the processing vessel, conversely has a tendency to be in a over heating state to promote corrosion.

Therefore, in conventional single wafer heat treatment systems, a temperature control system, such as a heat transfer medium circulating system, is provided for running a heat transfer medium through a medium passage, which is provided in the side wall and/or bottom portion of a processing vessel, to control temperature so that the temperature of the side wall and bottom portion is within a predetermined allowable temperature range.

By the way, the above described temperature control system, such as the heat transfer medium circulating system, requires a tank for maintaining the heat transfer medium at a constant temperature. The structure of this tank is very complicated, and a heat insulating means must be also provided around the circulating passage in which the heat transfer medium is circulated. Therefore, there are problems in that the whole system is not only very large to require a very large space, but costs and power consumption increase very much.

In addition, since a rolling mechanism, such as a compressor, for controlling the temperature of the heat transfer medium is used, it is required to periodically carry out maintenance. Moreover, as the heat transfer medium usually used herein, there are Galden (trade name) and Fluorinert (trade name) having a high vapor pressure in view of thermal efficiency and so forth. However, there is also a problem in that, if Galden and Fluorinert leak, they cause contamination having a serious bad influence in the production of a semiconductor integrated circuit.

DISCLOSURE OF THE INVENTION

The present invention has been made in order to effectively solve the above described problems. It is an object of the present invention to provide a heat treatment system, which is not only capable of appropriately controlling the temperature in a processing vessel, but also capable of reducing space and energy, by combining a resistive heating means with a thermoelectric conversion means.

According to the present invention, a heat treatment system comprises: a cylindrical processing vessel; a supporting table, raised by a support from a bottom portion of the processing vessel, for mounting thereon an object to be processed; processing object heating means, provided in the supporting table, for heating the object to be processed; thermoelectric conversion means which is provided in the bottom portion of the processing vessel and which is capable of selectively heating and cooling; resistive heating means provided in a side wall of the processing vessel; and a temperature control part for controlling operations of the thermoelectric conversion means and the resistive heating means.

Thus, the bottom portion of the vessel which must be heated or cooled in accordance with process conditions is selectively heated or cooled by the thermoelectric conversion means if necessary, and the side wall of the vessel which has a tendency to have a lower temperature than that of the bottom portion of the vessel during process to allow reaction by-products from adhering thereto is always heated by the resistive heating means, so that it is not only possible to control the processing vessel at an appropriate temperature, but it is also possible to minimize the whole system to reduce the space and energy.

In addition, since it is not required to provide any rolling mechanisms, it is possible to greatly improve maintenance performance in comparison with the temperature control system, such as the heat transfer medium circulator, which has been conventionally used.

In this case, the thermoelectric conversion means is preferably provided with a thermal conversion plate in which a medium passage for running a heat transfer medium to discard undesired heat and cold is formed. In addition, the thermal conversion plate is preferably provided on the side of a bottom face of the thermoelectric conversion means.

The bottom portion of the processing vessel may be provided with temperature measuring means for measuring a temperature of the bottom portion of the processing vessel, and the temperature control part may carry out a temperature control operation on the basis of a measured value of the temperature measuring means.

The temperature control part may measure the temperature of the bottom portion of the processing vessel on the basis of a voltage due to the Seebeck effect of the thermoelectric conversion means, and carry out a temperature control operation on the basis of a measured value of the temperature of the bottom portion of the processing vessel. Thus, it is not required to provide any temperature measuring means, such as a thermocouple.

The thermoelectric conversion means may include a Peltier device.

The thermoelectric conversion means may be provided with a thermal conversion plate in which a medium passage for running a heat transfer medium to discard undesired heat and cold is formed, and the Peltier device may be provided between the bottom portion of the processing vessel and the thermal conversion plate. The Peltier device may be bonded to the thermal conversion plate.

The resistive heating means may comprise a plurality of rod-shaped cartridge heaters. The cartridge heaters may be buried in the side wall of the processing vessel so as to extend in vertical directions.

BRIEF DESCRIPTION OF THE DRAWINGS

FIG. 2 is a schematic cross-sectional view of the heat treatment system shown in FIG. 1;

FIG. 3 is a vessel bottom view showing the state of arrangement of thermoelectric conversion elements of the heat treatment system shown in FIG. 1;

FIG. 5 is an enlarged view showing the bottom of a heat treatment system, wherein (A) shows a case where a current flows in a direction so that the top face side of a Peltier device is at a lower temperature and the opposite side is at a higher temperature, and (B) shows the opposite case thereto.

BEST MODE FOR CARRYING OUT THE INVENTION

Referring now to the accompanying drawings, a preferred embodiment of a heat treatment system according to the present invention will be described below in detail.

Figure 1:
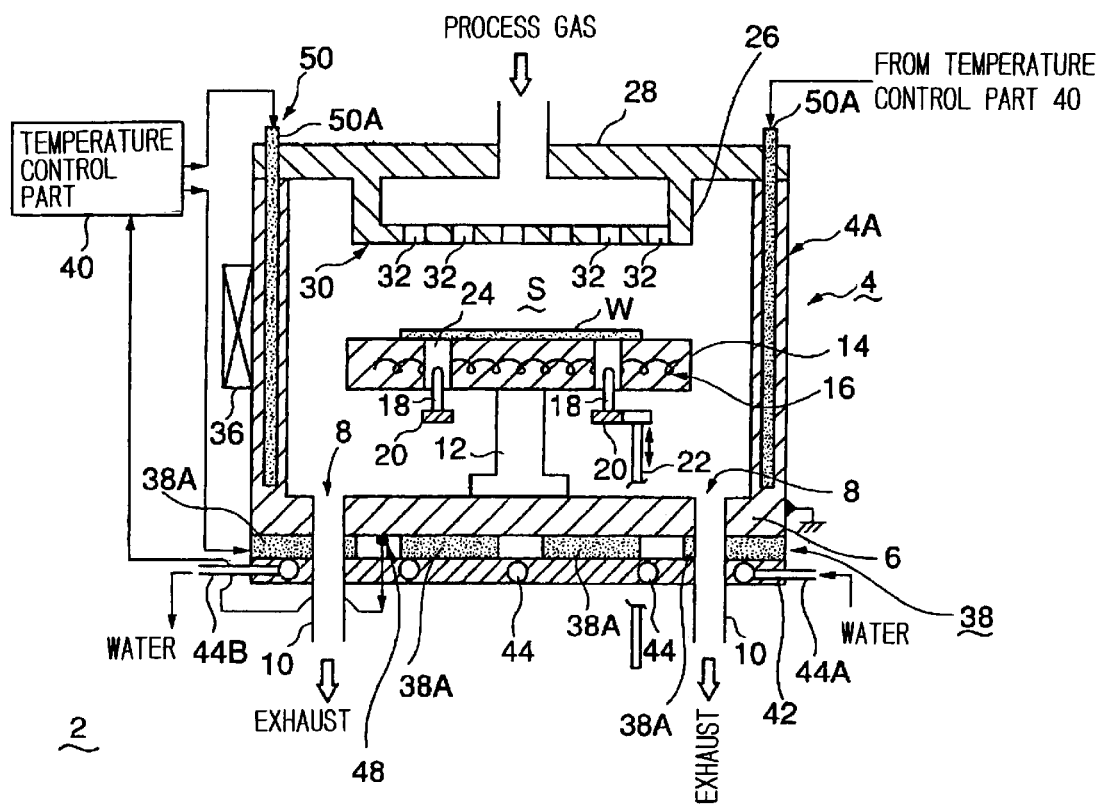
FIG. 1 is a diagram showing the construction of a heat treatment system according to the present invention.
Figure 4:
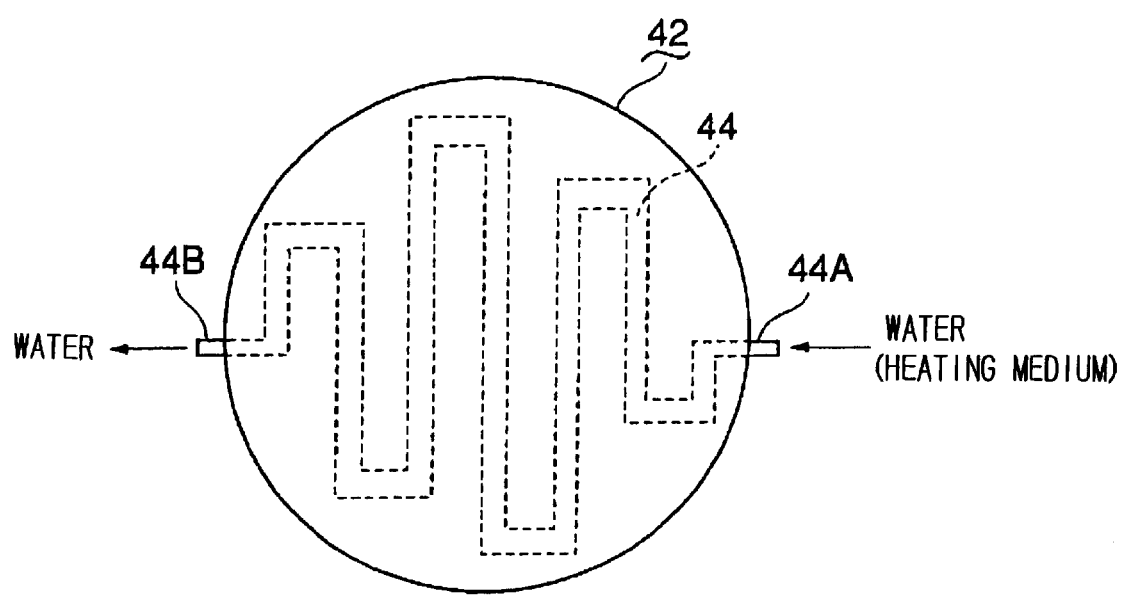
FIG. 4 is a plan view showing a thermal conversion plate.

FIG. 1 is a diagram showing the construction of a heat treatment system according to the present invention, and FIG. 2 is a schematic cross-sectional view of the heat treatment system shown in FIG. 1. FIG. 3 is a vessel bottom view showing the state of arrangement of thermoelectric conversion elements of the heat treatment system shown in FIG. 1, and FIG. 4 is a plan view showing a thermal conversion plate. FIG. 5 is an enlarged view showing the bottom of a heat treatment system.

As shown in these figures, this heat treatment system 2 has a cylindrical processing vessel 4 of, e.g., aluminum. For example, this processing vessel 4 is grounded. In the bottom portion 6 of the processing vessel 4, exhaust ports 8 are provided for discharging atmosphere in the vessel. The exhaust ports 8 are connected to an exhaust system 10 including a vacuum pump (not shown) so as to be capable of uniformly evacuating the interior of the processing vessel 4 from the peripheral portions of the bottom thereof.

In the processing vessel 4, a disk-shaped supporting table 14 is provided on a support 12 of a conductive material, e.g., hastelloy, raised from the bottom portion 6. On the supporting table 14, a semiconductor wafer W, such as a silicon substrate, serving as an object to be processed, can be mounted. The supporting table 14 is made of, e.g., aluminum nitride. In the supporting table 14, there is buried a resistive heater pattern 16 which is formed so as to have a predetermined pattern as a processing object heating means.

Below the supporting table 14, a plurality of, e.g., three, lifter pins 18 (only two are shown in the figure) are provided so as to be raised upward. The base portions of the lifter pins 18 are commonly connected to an annular connecting member 20. This annular connecting member 20 engages the top end of a lifting rod 22 which airtightly passes through the bottom portion 6 of the processing vessel 4 to extend in vertical directions. Thus, by vertically moving the lifting rod 22, the lifter pins 18 are designed to pass through the supporting table 14 to be inserted into lifter pin holes 24 to lift the wafer W.

In the ceiling portion of the processing vessel 4, a ceiling plate 28 integrally provided with a shower head 26 as a gas supply means is airtightly mounted. The shower head 26 faces the top face of the supporting table 14 so as to substantially cover the entire top face of the supporting table 14, so that a processing space S is formed between the shower head 26 and the supporting table 14. The shower head 26 is designed to feed various gases into the processing space S like a shower. In the injection face 30 of the bottom face of the shower head 26, a large number of nozzles 32 for injecting gases are formed.

In a part of a side wall of the processing vessel 4, a port 34 (see FIG. 2) is provided. The carrying-out port 34 is provided with a gate valve 36 capable of being airtightly open and closed when the wafer W is carried in and out of the processing vessel 4.

On the bottom side of the bottom portion 6 of the processing vessel 4, a thermoelectric conversion means 38, which is a feature of the present invention, is provided so as to be capable of selectively heating and cooling the bottom portion 6 of the processing vessel 4. Specifically, for example, the thermoelectric conversion means 38 comprises Peltier devices 38A comprising two different kinds of semiconductors or metals bonded to each other. For example, in the shown embodiment, seven quadrangular Peltier devices 38A (see FIG. 3) are bonded to the whole bottom face of the bottom portion 6 of the processing vessel 4. As is well known, the Peltier device 38A is designed to operate so that the top side is heated or cooled in accordance with the direction of a current flowing therethrough. Furthermore, the bottom side of the Peltier device 38A exhibits the opposite operation to the top side. FIG. 5 shows an enlarged view of such a well-known Peltier device 38A wherein P-type semiconductors and N-type semiconductors are alternately bonded to each other by conductive members 39, both sides of which are bonded to thin insulators 41.

The control of the current flowing through each of the Peltier devices 38A is carried out by a temperature control part 40 comprising, e.g., a microcomputer.

To the bottom side of each of the Peltier devices 38A, a large-diameter disk-shaped thermal conversion plate 42 of a thermal conductive material, such as aluminum, is bonded. The thermal conversion plate 42 is thickened, and a substantially meandering medium passage 44 is formed in the thermal conversion plate 42 so as to extend over the whole area of the plate as shown in FIG. 4. A heat transfer medium of a certain temperature, e.g., water of a room temperature, is run from a medium inlet 44A of the medium passage 44 to a medium outlet 44B thereof to carry heat or cold on the bottom side of each of the Peltier devices 38A to the outside to exhaust heat or cold to maintain the temperature on the bottom side of each of the Peltier devices 38A at a substantially constant temperature to maintain the heat transfer effect. The heat transfer medium should not be limited to water. For example, Fluorinert or the like may be used as the heat transfer medium. Furthermore, aside of the thermal conversion plate 42, a circulating system may be provided between the medium inlet 44A and the medium outlet 44B, and a temperature controller may be provided in the way of the circulating system to circulate water at a constant temperature.

In the bottom portion 6 of the processing vessel 4, a temperature measuring means, e.g., a thermocouple 48, for measuring the temperature of the bottom portion 6 is provided so as to be capable of inputting the measured value to the temperature control part 40.

In the sidewall 4A of the processing vessel 4, a resistive heating means 50 for heating the side wall 4A is provided. Specifically, for example, the resistive heating means 50 comprises a plurality of rod-shaped cartridge heaters 50A which are buried in the side wall 4A of the processing vessel 4 at substantially regular intervals so as to extend in vertical directions. The control of each of the cartridge heaters 50A can be carried out by the temperature control part 40.

Also referring to FIG. 5, an example of a deposition method carried out by the heat treatment system with the above described construction will be described below.

First, in a case where a Ti film is deposited as an example of a deposition processing, a semiconductor wafer W is introduced into the processing vessel 4 via an open gate valve 36 to be mounted on the supporting table 14 to close the processing vessel 4. After the processing vessel 4 is closed, required gases as process gases for deposition, such as $TiCl_4$ and $H_2$ gases, are fed from the shower head 26 into the processing vessel 4 at predetermined flow rates while controlling the flow rates, and the interior of the processing vessel 4 is evacuated by an evacuating pump to maintain a predetermined pressure therein.

Simultaneously, the wafer W is heated and maintained at a predetermined temperature by the resistive heater pattern 16 buried in the supporting table 14. Thus, $TiCl_4$ gas is thermally decomposed to deposit a Ti film on the surface of the wafer W. For example, as process conditions at this time, the process pressure is in the range of from about 13 Pa (≈0.1 Torr) to about 800 Pa (≈6 Torr), and the process temperature is in the range of from about 600° C. to about 700° C.

Reaction by-products produced during the above described deposition reaction have a tendency to adhere relatively low-temperature portions to be deposited thereon, since the reaction by-products can be in a gas state only at high temperatures if the vapor pressure is high. In this case, since the side wall 4A of the processing vessel 4 is spaced from the supporting table 14 via the processing space S, the temperature of the side wall 4A is a lower temperature, so that there is the possibility that the reaction by-products adhere thereto. Therefore, the temperature control part 40 supplies electric power to each of the resistive cartridge heater 50A to heat the side wall 4A of the processing vessel 4 to a predetermined temperature to prevent the reaction by-products from adhering thereto.

In this case, the temperature of the side wall 4A is preferably in the range of, e.g., from about 100° C. to about 200° C. although it depends on the adhesion temperature of the reaction by-products.

On the other hand, since a large quantity of heat is transferred to the bottom portion 6 of the processing vessel 4 from the supporting table 14 via the support 12 of a thermal conductive material although the bottom portion 6 is spaced from the supporting table 14, the temperature of the bottom portion 6 has a tendency to be far higher than that of the side wall 4A, so that there is the possibility that the inner surface and so forth of the bottom portion 6 of the processing vessel 4 are corroded with heat in accordance with the process temperature if it is left as it is. Therefore, in this preferred embodiment, in such a case, the temperature control part 40 causes a current to pass through each of the Peltier devices 38A of the thermoelectric conversion means 38, which is provided in the bottom portion 6 of the processing vessel, to cool the bottom portion 6. The direction of the current passing through each of the Peltier devices 38A is such a direction that the top face side (the face contacting the bottom face of the bottom portion 6) of each of the Peltier devices 38A is at a lower temperature and the opposite side thereto is at a higher temperature. Thus, the bottom portion 6 of the processing vessel 4 is cooled to a predetermined temperature. This cooling temperature is in the range of, e.g., from about 100° C. to about 200° C., which is the same as that of the sidewall 4A, although it depends on the adhesion temperature of the reaction by-products.

In this case, since it is required to maintain the temperature of the bottom face side at a substantially constant lower temperature in order to maintain the top face side of the Peltier device 38A at a low temperature, water serving as a heat transfer medium of about a room temperature is caused to flow through the medium passage 44 of the thermal conversion plate 42. Thus, heat generated from the bottom face side of the Peltier device 38A is carried by the heat transfer medium to the outside of the system to be discarded, so that cooling of the bottom portion 6 of the processing vessel 4 can stably continue.

The temperature at this time is measured by the thermocouple 48, which is provided in the bottom portion 6 of the processing vessel 4, to be inputted to the temperature control part 49, so that the current passing through each of the Peltier devices 38A is controlled on the basis of the measured value.

In this case, in order to control the temperature of the side wall 4A of the processing vessel 4, the thermocouple may be provided in the side wall 4A of the processing vessel 4 for directly measuring this temperature. However, when the Peltier devices 38A and the cartridge heaters 50A are not provided, the temperature difference between the bottom portion 6 and side wall 4A of the processing vessel 4 has been revealed every process by experience. Therefore, the electric power supplied to the cartridge heaters 50A may be controlled so as to be a value determined with respect to the electric power supplied to the Peltier devices 38A.

Since the bottom portion 6 of the processing vessel 4 having a tendency to be exposed to high temperatures can be thus maintained at a predetermined temperature, it is possible to prevent the inner surface of the bottom portion 6 of the processing vessel 4 from being corroded at high temperatures.

In the above described preferred embodiment, the temperature of the bottom portion 6 of the processing vessel is prevented from excessively rising. However, if the process temperature is low, the temperature of the bottom portion 6 of the processing vessel 4 does not so rise, and there are some cases where production by-products are deposited similar to the side wall 4A of the processing vessel 4.

In such a case, the temperature control part 40 causes a current to pass through the Peltier device 38A in the opposite direction to the above described direction as shown in FIG. 5(B), to raise the temperature of the top face side of the Peltier device 38A to heat the bottom portion 6 of the processing vessel 4 so as to prevent reaction by-products from being deposited thereon. In this case, since the temperature of the bottom face of the Peltier device 38A is a lower temperature due to generated cold, water flowing through the medium passage 44 of the thermal conversion plate 42 conversely carries and discard cold to the outside of the system, so that it is possible to stably continue heating the bottom portion 6 of the processing vessel 4. Furthermore, the temperature of the bottom portion of the processing vessel in this state is controlled by combining the Joule heat of the Peltier device 38A itself with heat generated by the Peltier effect.

Thus, by using only the thermoelectric conversion means 38, such as the Peltier device 38A, and a simple member, such as the resistive cartridge heater 50, without the need of a large temperature control system, such as a heat transfer medium circulator which has been used in conventional systems, it is possible to prevent reaction by-products from adhering to and being deposited on the side wall 4A of the processing vessel 4, and it is possible to prevent the bottom portion 6 of the processing vessel 4 from being corroded and to prevent reaction by-products from adhering thereto and being deposited thereon, similar to conventional systems.

While the thermocouple 48 has been provided in the bottom portion 6 of the processing vessel 4 for measuring the temperature of the bottom portion 6 of the processing vessel 4 in this preferred embodiment, the Seebeck effect of the Peltier effect 38A may be utilized for measuring the temperature of the bottom portion 6 of the processing vessel 4 without the need of the thermocouple. Specifically, the temperature control part 40 intermittently interrupts feeding to the Peltier device 38A. Then, when this feeding is not carried out, electromotive force due to the temperature difference between the top and bottom faces of the Peltier device 38A is caused by the Seebeck effect of the Peltier device 38A. By measuring this electromotive force by the temperature control part 40, the temperature of the bottom portion 6 of the processing vessel 4 may be obtained.

In this case, it is not required to provide the thermocouple 48 for measuring the temperature of the bottom portion 6 of the processing vessel 4 as described above.

While the temperature of the side wall 4A and bottom portion 6 of the processing vessel 4 has been set to be in the range of from 100° C. to 200° C. in the above described preferred embodiment, this is only an example. Of course, this may be suitably changed in accordance with the deposition temperature and so forth of produced reaction by-products and so forth.

While the deposition processing has been described as an example of a heat treatment, the present invention should not be limited thereto, but the invention may be applied to other heat treatments, such as oxidation diffusion, etching and annealing. Moreover, the present invention may be applied to plasma processing systems using high frequency waves and microwaves.

While the silicon substrate has been used as an object to be processed, the present invention should not be limited thereto, but the method according to the present invention may be applied to LCD substrates and glass substrates.

As described above, the heat treatment system according to the present invention can have the following excellent operations and effects.

The bottom portion of the vessel which must be heated or cooled in accordance with process conditions is selectively heated or cooled by the thermoelectric conversion means if necessary, and the sidewall of the vessel which has a tendency to have a lower temperature than that of the bottom portion of the vessel during process to allow reaction by-products from adhering thereto is always heated by the resistive heating means, so that it is not only possible to control the processing vessel at an appropriate temperature, but it is also possible to minimize the whole system to reduce the space and energy.

Since it is not required to provide any rolling mechanisms, it is possible to greatly improve maintenance performance in comparison with the temperature control system, such as the heat transfer medium circulator, which has been conventionally used.

It is also possible to omit any temperature measuring means, such as a thermocouple.

What is claimed is:

1. A heat treatment system comprising:

a cylindrical processing vessel;

a supporting table, raised by a support from a bottom portion of said processing vessel, for mounting thereon an object to be processed;

processing object heating means, provided in said supporting table, for heating said object to be processed;

thermoelectric conversion means which is provided in the bottom portion of said processing vessel and which is capable of selectively heating and cooling;

resistive heating means provided in a side wall of said processing vessel; and a temperature control part for controlling said thermoelectric conversion means and said resistive heating means.

2. A heat treatment system as set forth in claim 1, wherein said thermoelectric conversion means is provided with a thermal conversion plate in which a medium passage for running a heat transfer medium to discard undesired heat and cold is formed.

3. A heat treatment system as set forth in claim 2, wherein said thermal conversion plate is provided on the side of a bottom face of said thermoelectric conversion means.

4. A heat treatment system as set forth in claim 1, wherein said bottom portion of said processing vessel is provided with temperature measuring means for measuring a temperature of said bottom portion of said processing vessel, and said temperature control part carries out a temperature control on the basis of a measured value of said temperature measuring means.

5. A heat treatment system as set forth in claim 1, wherein said temperature control part measures the temperature of said bottom portion of said processing vessel on the basis of a voltage due to the Seebeck effect of said thermoelectric conversion means, and carries out a temperature control on the basis of a measured value of the temperature of said bottom portion of said processing vessel.

6. A heat treatment system as set forth in claim 1, wherein said thermoelectric conversion means includes a Peltier device.

7. A heat treatment system as set forth in claim 6, wherein said thermoelectric conversion means is provided with a thermal conversion plate in which a medium passage for running a heat transfer medium to discard undesired heat and cold is formed, and said Peltier device is provided between said bottom portion of said processing vessel and said thermal conversion plate.

8. A heat treatment system as set forth in claim 7, wherein said Peltier device is bonded to said thermal conversion plate.

9. A heat treatment system as set forth in claim 1, wherein said resistive heating means comprises a plurality of rod-shaped cartridge heaters.

10. A heat treatment system as set forth in claim 9, wherein said cartridge heaters are buried in said side wall of said processing vessel so as to extend in vertical directions.

11. A heat treatment system comprising:

a cylindrical processing vessel;

a supporting table, raised by a support from a bottom portion of said processing vessel, for mounting thereon an object to be processed;

processing object heating means, provided in said supporting table, for heating said object to be processed;

thermoelectric conversion means which is provided in the bottom portion of said processing vessel and which is capable of selectively heating and cooling;

heating means provided in a side wall of said processing vessel; and a temperature control part for controlling said thermoelectric conversion means and said heating means, wherein said thermoelectric conversion means is provided between the bottom portion of the processing vessel and a thermal conversion plate in which a medium passage for running a heat transfer medium to discard undesired heat and cold is formed.

* * * * *